(12) United States Patent
Jun

(10) Patent No.: US 7,993,803 B2
(45) Date of Patent: Aug. 9, 2011

(54) METHOD FOR FABRICATING CHROMELESS PHASE SHIFT MASK

(75) Inventor: Jea Young Jun, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 128 days.

(21) Appl. No.: 12/473,406

(22) Filed: May 28, 2009

(65) Prior Publication Data

US 2010/0055579 A1 Mar. 4, 2010

(30) Foreign Application Priority Data

Sep. 4, 2008 (KR) .................. 10-2008-0087475

(51) Int. Cl.
*G03F 1/00* (2006.01)
(52) U.S. Cl. ............................. 430/5; 438/706
(58) Field of Classification Search .............. 430/5, 311, 430/313; 216/41; 438/706
See application file for complete search history.

(56) References Cited

U.S. PATENT DOCUMENTS

| | | | |
|---|---|---|---|
| 5,240,796 A | 8/1993 | Lee et al. | |
| 7,005,217 B2 | 2/2006 | Bailey et al. | |
| 7,767,365 B2* | 8/2010 | Carpenter et al. | 430/5 |
| 2004/0180548 A1* | 9/2004 | Tzu et al. | 438/694 |
| 2006/0019176 A1* | 1/2006 | Kim et al. | 430/5 |
| 2006/0166106 A1* | 7/2006 | Chandrachood et al. | 430/5 |
| 2007/0092839 A1* | 4/2007 | Tan et al. | 430/311 |

FOREIGN PATENT DOCUMENTS

| | | |
|---|---|---|
| KR | 10-2000-0018720 | 4/2000 |
| KR | 10-2006-0049495 | 5/2006 |
| KR | 10-2007-0059755 | 6/2007 |
| KR | 10-2008-0001467 | 1/2008 |

* cited by examiner

*Primary Examiner* — Mark F Huff
*Assistant Examiner* — Stewart A Fraser
(74) *Attorney, Agent, or Firm* — Marshall, Gerstein & Borun LLP

(57) ABSTRACT

A method for fabricating a chromeless phase shift mask having a phase shift mask with a groove shape includes: forming a recess region with a first depth between the phase shift regions of a substrate; forming a plug for a mask that fills the recess region; forming a mask pattern aligned with the mask plug over the mask plug; and forming a groove with a second depth in the substrate by etching using the mask pattern.

10 Claims, 4 Drawing Sheets

METHOD FOR FABRICATING CHROMELESS PHASE SHIFT MASK

CROSS-REFERENCE TO RELATED APPLICATION

Priority to Korean patent application number 10-2008-0087475, filed on Sep. 4, 2008, the entire disclosure of which is incorporated by reference in its entirety, is claimed.

BACKGROUND OF THE INVENTION

The invention relates to a method for fabricating a photomask and, more particularly, to a method for fabricating a chromeless phase shift mask.

A photomask formed with a pattern is used to realize a desired pattern on a wafer in a process of fabricating a semiconductor device. Since the pattern realized on the photomask is transferred onto the wafer, the process of fabricating the photomask is very important.

As the degree of integration of semiconductor devices increases and pattern sizes are miniaturized, it becomes more difficult to precisely realize the desired pattern on a wafer. Therefore, there has been suggested a phase shift mask on which a phase shift region with a protruded shape is formed, or a chromeless phase shift mask in which a transmissive phase shift groove is formed in a mask substrate and a pattern is formed only by a phase difference of light.

To fabricate a chromeless phase shift mask, a light-shielding layer and a resist layer are formed on a transparent substrate and a photolithography process is performed to form a resist layer pattern that exposes a 180° phase region. The exposed portion of the light-shielding layer is etched using the resist layer pattern as an etch mask to form a light-shielding layer pattern. After the resist layer pattern is removed, the exposed portion of the substrate is etched using the light-shielding layer pattern as an etch mask to form a phase shift region with a groove shape in the substrate.

In the etch process for forming the phase shift region, the transmissive substrate is etched after an etch condition is set to the transmissive substrate. However, the light-shielding layer is exposed to an etch source gas in the process of forming the phase shift region with a groove shape. Therefore, an upper edge portion of the light-shielding layer pattern is attacked, and a critical dimension (CD) and a profile of the light-shielding layer pattern are thus varied to slope a side wall of the light-shielding layer pattern. As such, as the light-shielding layer pattern that functions as an etch mask is varied into the sloped side wall profile, the exposed CD of the bottom of the phase shift region with a groove shape formed in the substrate is narrowed with the etch and the phase shift region has a sloped side wall profile. Also, it is difficult to control an etch depth of the phase shift region and thus obtain an optimal side wall profile. Therefore, technology is needed to solve the problem caused in the process of fabricating the chromeless phase shift mask by controlling the CD and profile of the light-shielding layer.

SUMMARY OF THE INVENTION

In one embodiment, a method for fabricating a chromeless phase shift mask having a phase shift mask with a groove shape includes: forming a recess region with a first depth between the phase shift regions of a substrate; forming a plug for a mask, wherein the plug fills the recess region; forming a mask pattern aligned with the mask plug over the mask plug; and forming a groove with a second depth in the substrate by etching using the mask pattern.

Preferably, forming the recess region is implemented by etching using a mask pattern containing chromium.

Preferably, etching to form the recess region is implemented using an etch gas comprising carbon tetrafluoride ($CF_4$), methylene fluoride ($CH_2F_2$), and oxygen ($O_2$) gases.

The method may further comprise, after forming the recess region, curing a side face and a bottom of the recess region by oxidizing the substrate formed with the recess region with oxygen plasma.

Preferably, forming the mask plug comprises forming a plug layer over the substrate formed with the recess region; and exposing an upper surface of the substrate by etching on the entire surface of the plug layer.

Preferably, the plug layer comprises chromium.

Preferably, etching on the entire surface is implemented using an etch source gas comprising a chlorine ($Cl_2$) gas and an oxygen ($O_2$) gas.

Preferably, the mask pattern comprises a chromium layer.

The method may further include, after forming the mask pattern, measuring a critical dimension (CD) of the mask pattern; and correcting the CD of the mask pattern according to the result of the measurement by additionally etching the mask pattern with maintaining the CD by the mask plug.

In another embodiment, a method for fabricating a chromeless phase shift mask having a phase shift mask with a groove shape comprises: selectively forming a recess region with a first depth between the phase shift regions of a substrate; forming a plug for a mask, wherein the plug fills the recess region; selectively forming a light-shielding layer pattern over the mask plug and the substrate; exposing the mask plug by selectively removing the light-shielding layer pattern formed over the mask plug; and removing the exposed mask plug.

DESCRIPTION OF SPECIFIC EMBODIMENTS

Figure 1:
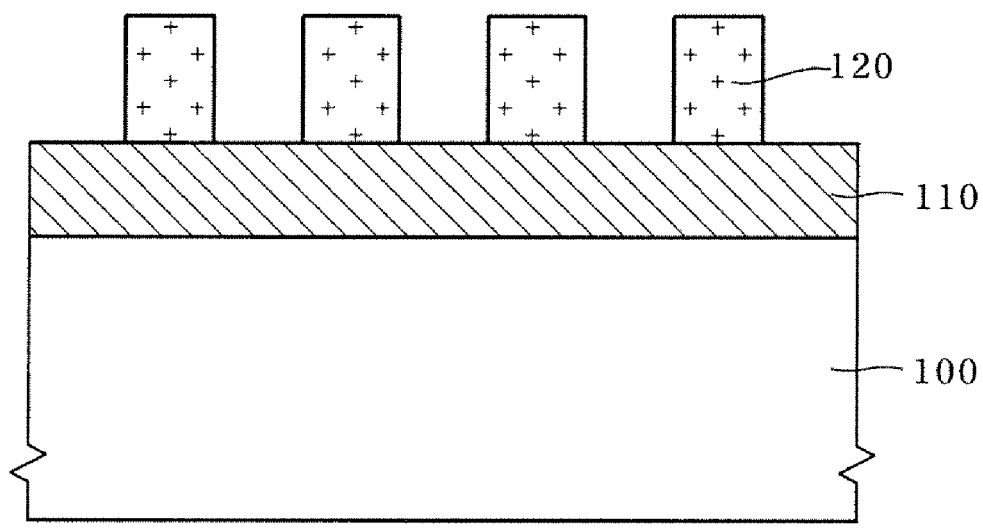
FIGS. 1 through 8 are cross-sectional views illustrating a method for fabricating a chromeless phase shift mask in accordance with an embodiment of the invention.

Referring to FIG. 1, in a method for fabricating a chromeless phase shift mask, a mask layer 110 is first formed over a transparent substrate 100 such as quartz and a first resist layer pattern 120 that selectively exposes the mask layer 110 over the mask layer 110. The mask layer 110 preferably comprises a chromium layer. Here, when the mask layer comprises a chromium layer, the chromium layer preferably has a thickness of 250 Å to 300 Å. The first resist layer pattern 120 is disposed so that a phase shift region with a groove shape which will be formed later is blocked and the portion of the mask layer 110 which is not formed with the phase shift region thereon is exposed.

Figure 2:
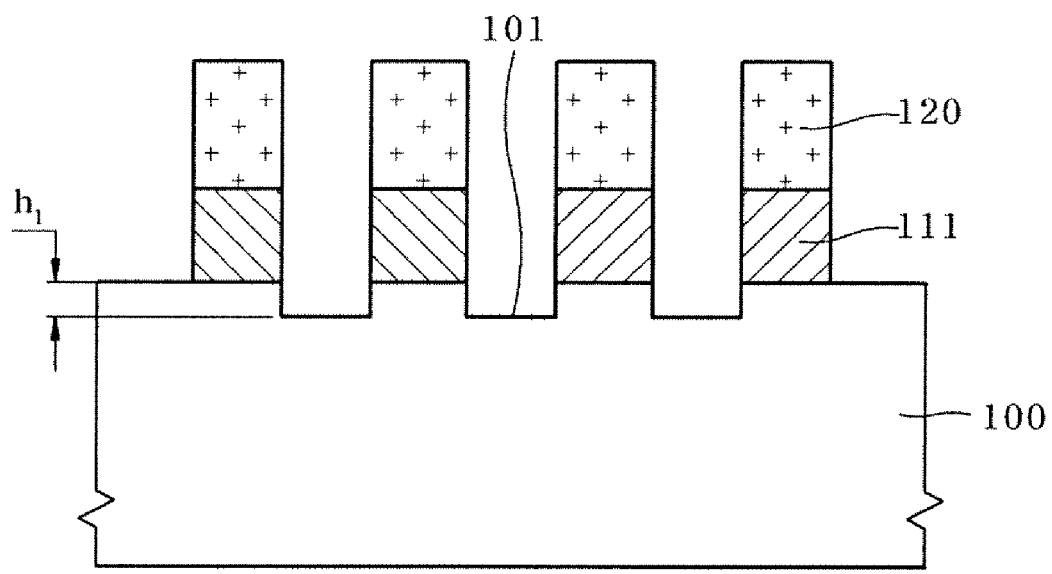

Referring to FIG. 2, an etch process using the first resist layer pattern 120 is performed to form a mask layer pattern 111. At this time, the mask layer pattern 111 preferably is formed using an etch source gas comprising an oxygen ($O_2$) gas when the mask layer pattern 111 is formed of a chromium (Cr) layer. The mask layer pattern 111 ensures an etch margin upon an etching process for forming a recess region to be formed in the substrate.

The portion of the transparent substrate 100 exposed by the first resist layer pattern 120 and the mask layer pattern 111 is etched by a first depth ($h_1$) to form a recess region 101.

Preferably, carbon tetrafluoride (CF$_4$), methylene fluoride (CH$_2$F$_2$), and oxygen (O$_2$) gases are supplied onto the transparent substrate 100 formed with the mask layer pattern 111. Then, the portion of the transparent substrate 100 exposed by the first resist layer pattern 120 and the mask layer pattern 111 is selectively etched and the recess region 101 is thus formed in the transparent substrate 100. The recess region 101 preferably has a depth corresponding to the thickness (h$_1$) of the etch mask to be formed later, for example, to a depth of 150 Å to 180 Å from the upper surface of the transparent substrate 100.

In the process of forming the recess region 101, though the first resist layer pattern 120 is lost by the etch source and the profile thereof is thus varied, the side wall profile is maintained in the mask layer pattern 111 and the vertically etched recess region 101 thus can be formed. This recess region 101 functions to selectively form a plug for a mask in the transparent substrate in a main region.

Meanwhile, after the recess region 101 is formed, the side face and bottom of the recess region 101 can be oxidized with oxygen plasma to cure the portion of the transparent substrate damaged by the etch source gas. Since the profile of the side face and the bottom of the recess region have an influence on the profile of the plug for a mask to be formed later, it is possible to minimize the influence on the plug for a mask by curing the portion damaged by the etch source gas.

Figure 3:
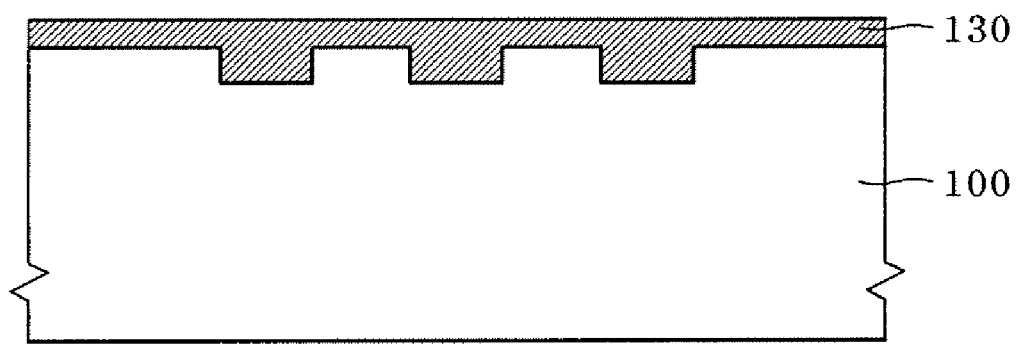

Referring to FIG. 3, the first resist layer pattern (120 in FIG. 2) and the mask layer pattern (111 in FIG. 2) are selectively removed and a plug layer 130 that covers the recess region is then formed over the transparent substrate 100 formed with the recess region 101. The plug layer 130 preferably comprises a chromium (Cr) layer and preferably has a thickness of 250 Å to 300 Å.

Figure 4:
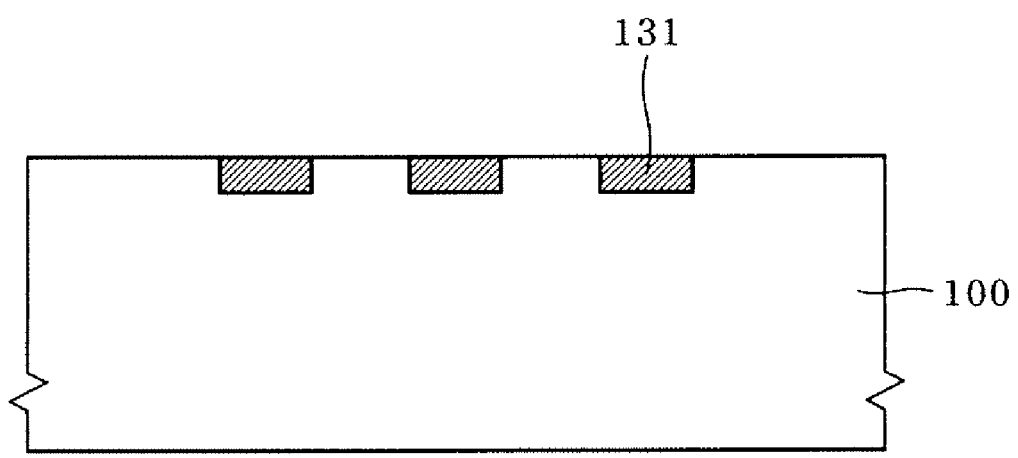

Referring to FIG. 4, an etching process on the entire surface of the plug layer 130 is performed to form the plug for a mask 131 in the transparent substrate 100. Specifically, an etch source gas is supplied onto the transparent substrate 100 formed with the plug layer (130 in FIG. 3) to etch the plug layer 130 until the upper surface of the transparent substrate is exposed. Then, the plug layer 130 is left only in the recess region 101 and the mask plug 131 is selectively formed in the transparent substrate 100. Here, when the plug layer 130 is formed including a chromium (Cr) layer, an etch source gas containing a chlorine (Cl$_2$) gas and an oxygen (O$_2$) gas preferably are used as the etch source gas. At this time, since the mask plug 131 is formed along the profile of the recess region 101, the mask plug 131 can be formed so as to have the vertical side wall profile with maintaining the CD of the recess region.

The mask plug 131 compensates the thickness of a light-shielding layer to be used as an etch mask upon an etch process for forming the phase shift region, thereby allowing an etch margin to be ensured even though deformation of the light-shielding layer is generated. Also, the mask plug 131 functions as a correction mask if a correction process is required. Consequently, the mask plug 131 can, even though the light-shielding layer used as an etch mask is damaged and deformed in the etch process, prevent that the side wall is damaged and a sloped profile is thus generated in the subsequent etching process for forming the phase shift region.

Figure 5:
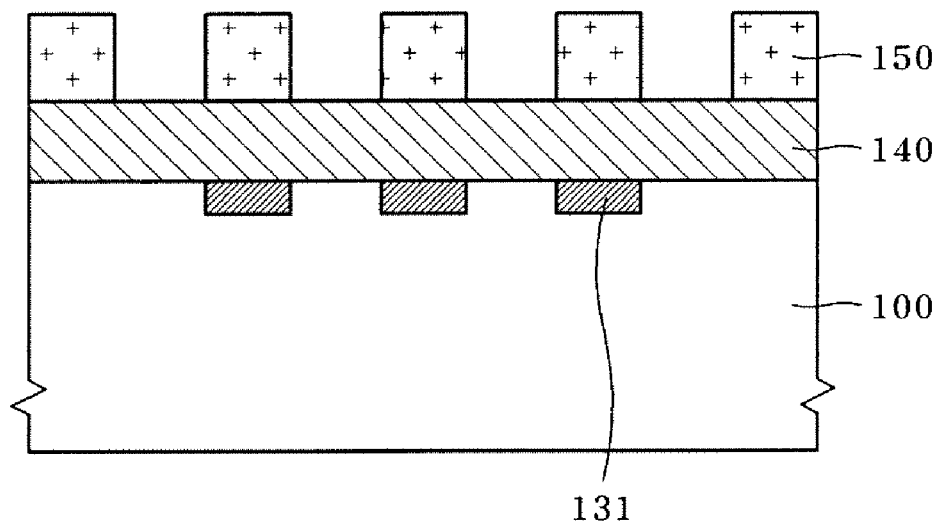

Referring to FIG. 5, the light-shielding layer is formed over the transparent substrate 100 formed with the mask plug 131, and a second resist layer pattern 150 that selectively exposes the light-shielding layer 140 is formed over the light-shielding layer 140. The light-shielding layer 140 preferably comprises a chromium (Cr) layer. The second resist layer pattern 150 can be disposed to expose the phase shift region with a groove shape which will be formed later.

Figure 6:
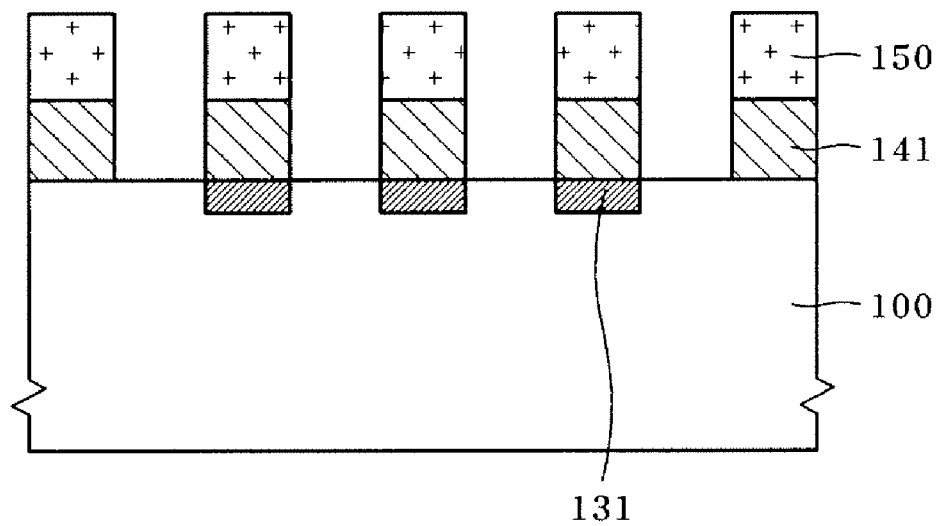

Referring to FIG. 6, an etch process using an etch process using the second resist layer pattern 150 as an etch mask is performed to a light-shielding layer pattern 141 that is aligned with the mask plug 131 and selectively exposes the transparent substrate 100. The etch process for the light-shielding layer pattern 141 preferably is performed by supplying an etch source gas comprising a chlorine (Cl$_2$) gas and an oxygen (O$_2$) gas. The light-shielding layer pattern 141 is used as an etch mask for forming the phase shift region with a groove shape, and, after being used as an etch mask, remains on a frame region of the transparent substrate to shield unnecessary light.

Figure 7:
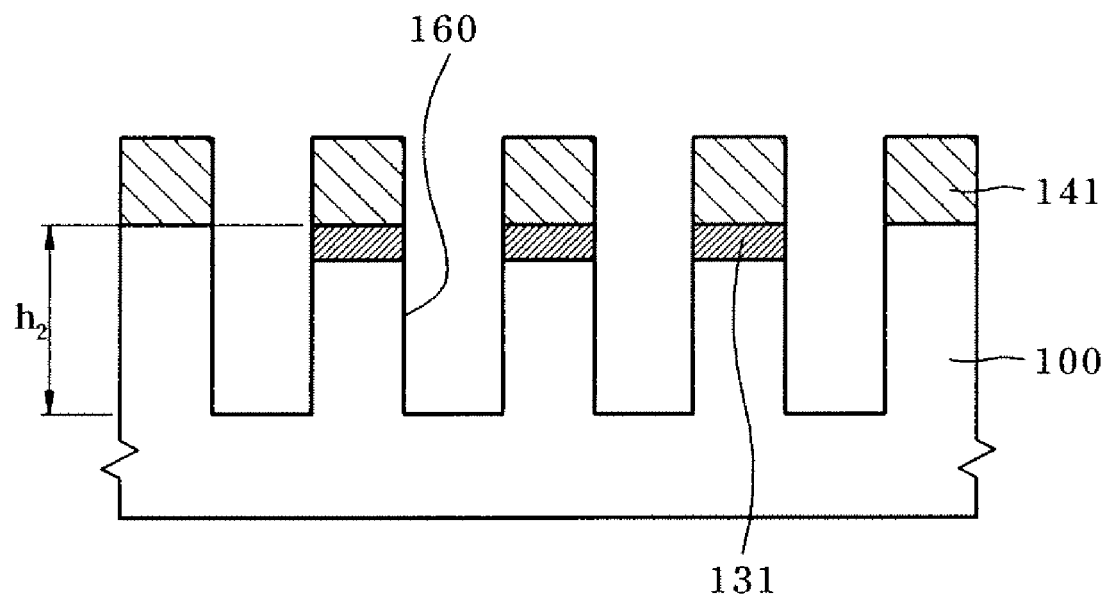

Referring to FIG. 7, a strip process is performed on the second resist layer pattern (150 in FIG. 6) to remove the second resist layer pattern. After that, a CD of the light-shielding layer 141 is measured to verify whether the formed CD is equal to a target CD of the light-shielding layer pattern 141. Since the light-shielding layer pattern 141 is used as an etch mask for forming the phase shift region, it is possible to estimate the CD of the phase shift region to be formed later by measuring the CD of the light-shielding layer 141 and estimating the space between the light-shielding layer patterns 141.

Meanwhile, a CD correction process can be performed on the light-shielding layer 141 according to the measuring result. For example, when the light-shielding layer pattern 141 is formed with a CD relatively larger than the target CD from the result of the CD measurement, a CD difference between the target CD and the CD of the light-shielding layer 141 is determined and a correction amount to be additionally etched by the CD difference is calculated, and the light-shielding layer pattern 141 is then additionally etched according to the correction amount, thereby capable of correcting the CD of the light-shielding layer pattern 141. At this time, since the CD is maintained by the mask plug 131 though an etch amount on the light-shielding layer pattern 141 is excessively increased for the correction process, it is possible to maintain the vertical side wall profile of the etch mask for forming the phase shift region.

Next, the exposed portion of the transparent substrate 100 is etched to a second depth (h$_2$) using the light-shielding layer pattern 141 and the mask plug 131 as an etch mask to form a phase shift region 160 with a groove shape. Preferably, carbon tetrafluoride (CF$_4$), methylene fluoride (CH$_2$F$_2$), and oxygen (O$_2$) gases are supplied onto the transparent substrate 100 formed with the light-shielding layer pattern 141. Then, the portion of the transparent substrate 100 blocked by the light-shielding layer pattern 141 and the mask plug 131 is not etched, but the portion of the transparent substrate 100 exposed by the light-shielding layer pattern 141 is etched to form the phase shift region 160 with a groove shape. Here, the phase shift region 160 is self-aligned by the light-shielding layer pattern 141 and the mask plug 131 and formed to a depth capable of shifting transmitted light by etching of the transparent substrate 100.

Meanwhile, although the light-shielding layer pattern 141 may be damaged and deformed by the etch source gas in the etch process for forming the phase shift region 160, the side face of the mask plug 131 is protected by the light-shielding layer pattern 141 and the CD of the phase shift region 160 can be maintained. For example, during the transparent substrate 100 is etched to the second depth (h$_2$), the profile of the mask plug 131 is maintained vertically even though the light-shielding layer pattern 141 is damaged. Also, even though the additional etch process is performed when an etch margin is insufficient, it is possible to control the etch depth of the phase shift region 160 by the mask plug 131 without deformation of the side wall profile. Therefore, it is possible to control the etch depth of the phase shift region 160 and form the vertical phase shift region 160 regardless of the damage of the light-shielding layer pattern 141.

Figure 8:
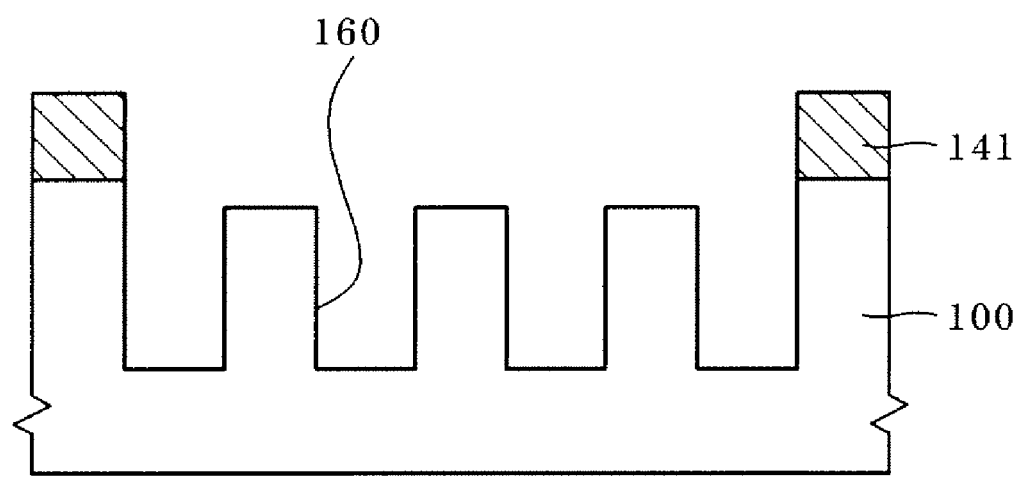

Referring to FIG. 8, to selectively remove a portion of the light-shielding layer pattern 141 and selectively remove the mask plug (131 in FIG. 7), a chromeless phase shift mask formed with the phase shift region 160 with a groove shape is formed in the transparent substrate 100. Here, the phase shift region 160 with a groove shape is disposed in a main region of the chromeless phase shift mask to shift the transmitted light and the light-shielding layer pattern 141 is disposed in the frame region of the chromeless phase shift mask to shield the transmitted light.

As is apparent from the above description, in accordance with a method for fabricating a chromeless phase shift mask of the invention, the mask plug is selectively formed in the transparent substrate and the self-aligned phase shift region is formed using the mask plug and the light-shielding layer pattern as an etch mask. Therefore, it is possible to form a critical phase shift region regardless of the damage of the light-shielding layer pattern.

While the invention has been described with respect to the specific embodiments, various changes and modifications may be made without departing from the spirit and scope of the invention as defined in the following claims.

What is claimed is:

1. A method for fabricating a chromeless phase shift mask having a phase shift mask with a groove shape, comprising:
   forming a recess region with a first depth between phase shift regions of a substrate;
   forming a plug for a mask, said plug filling the recess region;
   forming a mask pattern aligned with the mask plug over the mask plug; and
   forming a groove with a vertical profile with a second depth in the substrate by etching using the mask pattern and the plug.

2. The method of claim 1, comprising forming the recess region by etching using a mask pattern containing chromium.

3. The method of claim 2, comprising forming the recess region by etching using an etch gas comprising carbon tetrafluoride ($CF_4$), methylene fluoride ($CH_2F_2$), and oxygen ($O_2$) gases.

4. The method of claim 1, further comprising, after forming the recess region, curing a side face and a bottom of the recess region by oxidizing the substrate formed with the recess region with oxygen plasma.

5. The method of claim 1, wherein forming of the mask plug comprises:
   forming a plug layer over the substrate formed with the recess region; and
   exposing an upper surface of the substrate by etching on the entire surface of the plug layer.

6. The method of claim 5, wherein the plug layer contains chromium.

7. The method of claim 5, comprising etching the entire surface using an etch source gas comprising a chlorine ($Cl_2$) gas and an oxygen ($O_2$) gas.

8. The method of claim 1, wherein the mask pattern includes a chromium layer.

9. The method of claim 1, further comprising, after he forming of the mask pattern,
   measuring a critical dimension (CD) of the mask pattern; and
   correcting the CD of the mask pattern according to the result of the measurement by additionally etching the mask pattern with maintaining the CD by the mask plug.

10. A method for fabricating a chromeless phase shift mask having a phase shift mask with a groove shape, comprising:
    selectively forming a recess region with a first depth between phase shift regions of a substrate;
    forming a plug for a mask, the plug filling the recess region;
    selectively forming a light-shielding layer pattern over the mask plug and the substrate;
    forming a groove having a vertical profile with a second depth in the substrate by etching using the light-shielding layer pattern and the plug;
    exposing the mask plug by selectively removing the light-shielding layer pattern formed over the mask plug; and
    removing the exposed mask plug.

* * * * *